United States Patent [19]

Tamaki et al.

[11] Patent Number: 4,845,048
[45] Date of Patent: Jul. 4, 1989

[54] METHOD OF FABRICATING SEMICONDUCTOR DEVICE

[75] Inventors: Tokuhiko Tamaki, Sakai; Masafumi Kubota, Osaka, both of Japan

[73] Assignee: Matsushita Electric Industrial Co., Ltd., Osaka, Japan

[21] Appl. No.: 268,604

[22] Filed: Nov. 7, 1988

Related U.S. Application Data

[63] Continuation of Ser. No. 61,261, Aug. 26, 1985, abandoned.

[30] Foreign Application Priority Data

Jun. 12, 1986 [JP] Japan .................. 61-136531

[51] Int. Cl.⁴ .......................................... H01L 21/306
[52] U.S. Cl. .......................................... 437/62; 437/73; 437/67; 437/978; 156/644; 156/647; 156/650; 156/662; 148/DIG. 43; 148/DIG. 51; 148/DIG. 117
[58] Field of Search .................. 437/65, 76, 67; 156/644, 650; 148/DIG. 43

[56] References Cited

U.S. PATENT DOCUMENTS

| | | | |
|---|---|---|---|
| 4,008,107 | 2/1977 | Hayasaka et al. | 357/88 |
| 4,271,583 | 6/1981 | Kahng et al. | 357/49 |
| 4,272,776 | 6/1981 | Weijland et al. | 357/54 |
| 4,278,705 | 7/1981 | Agraz-Guerena et al. | 357/49 |
| 4,361,600 | 11/1982 | Brown | 156/613 |
| 4,502,913 | 3/1985 | Lechaton et al. | 357/49 |
| 4,551,743 | 11/1985 | Murakami | 357/50 |
| 4,661,832 | 4/1987 | Lechaton et al. | 357/47 |

OTHER PUBLICATIONS

Ghandhi, Sorab, *VLSI Fabrication Principles*, John Wiley & Sons, 1983, pp. 421-429.

*Primary Examiner*—Brian E. Hearn
*Assistant Examiner*—Beverly A. Pawlikowski
*Attorney, Agent, or Firm*—Wenderoth, Lind & Ponack

[57] ABSTRACT

A method of fabricating a semiconductor device which includes:

(1) a step of forming an opening in a silicon substrate using a first silicon oxide film and a first silicon nitride film formed on the silicon substrate as masks,
(2) a step of forming a second silicon oxide film and a second silicon nitride film on the side wall of the opening by the reduced pressure CVD method and anisotropic etching method,
(3) a step of performing isotropic dry etching using the first and second silicon oxide films as masks, and
(4) a step of performing heat treatment in an oxidizing atmosphere using the first and second silicon nitride films as masks.

Thereby, uniform isotropic etching may be accomplished by use of the dry etching method.

6 Claims, 6 Drawing Sheets

METHOD OF FABRICATING SEMICONDUCTOR DEVICE

This application is a continuation of now abandoned application Ser. No. 061,261, filed June 12, 1987.

BACKGROUND OF THE INVENTION

This invention relates to a method of fabricating a semiconductor device having high density, high speed, and low power consumption.

In a semiconductor integrated circuit, higher density, higher speed, and lower power consumption have been sought, and various attempts have been made in the development of devices of SOI (silicon-on-insulator) structure, to obtain higher density by decrease of the separation region between devices, or higher speed and lower power consumption by decrease of parasitic capacity generated between source-drain and substrate.

For example, Japanese Laid-open patent No. 54-88871 discloses a fabricating process of SOI structure semiconductor device of ditch separation development type. In this process, in the first place, a selectively opened thick $Si_3N_4$ film is formed on a silicon substrate. Then, using this $Si_3N_4$ film as a mask, an opening is formed in the silicon substrate by a strongly anisotropic dry etching method, for example, reactive ion etching (R.I.E.). To this steep opening plane of this opening part, a thin $Si_3N_4$ film is deposited by reduced pressure CVD process. And the surface thin $Si_3N_4$ film is removed by sputter etching method. Since the sputter etching method is excellent in the linearity of etching, the thin $Si_3N_4$ film at the side of the opening part is not etched, and only the upper surface of thick $Si_3N_4$ film and the thin $Si_3N_4$ film on the bottom of the silicon substrate opening part are etched. Afterwards, the silicon substrate is etched and oxidized, and an oxide region is formed in the silicon substrate, so that the entire lower surfaces of monocrystalline silicon insular regions located between adjacent opening parts are communicated by oxidation from both sides. Later, when the $Si_3N_4$ film is removed from the surface of monocrystalline silicon insular region, the lower face and side face of the monocrystalline silicon insular region are surrounded entirely by the oxide region.

The above etching of silicon substrate must be done isotropically from the viewpoint of stabilization of the shape of silicon insular region by oxidation process and decrease of defects in the silicon insular region due to shortening of oxidation time. In a similar fabricating method of SOI structure semiconductor device of ditch separation development type (Japanese Laid-open patent No. 58-250429), this isotropic etching is effected, for example, by wet process.

In the wet process etching, however, as the density becomes higher, the separation region between adjacent silicon islands becomes narrower, and the liquid is hard to penetrate. As a result, the etching shape may not be uniform, and some parts of the silicon island bottom are oxidized and others are not.

SUMMARY OF THE INVENTION

It is hence a primary object of this invention to present a method of fabricating a semiconductor device capable of performing uniform isotropic etching by employing dry etching.

That is, in this invention, the etching process by microwave discharge using $CF_4$, $O_2$ or other gas is applied to this isotropic etching process. Since only the reactive radical contributes to etching, etching progresses isotropically and equally as in the broad separation region in the depthwise direction, as well as in the separation region between silicon islands of 0.2 μm or less. The same holds true with the plasma etching using $SF_6$ gas. In the etching by this microwave discharge, when silicon nitride film is used as an antioxidation film, the selectivity ratio of silicon and silicon nitride film is not sufficient, but this problem has been solved by coating the silicon nitride film as an antioxidation film in the next oxidation process with an antietching mask such as silicon oxide film, on both top and sides of the silicon islands.

According to the present invention as described herein, the following benefits, among others, are obtained.

(1) In fabricating technology of SOI structure device of ditch separation development type, by isolating the antietching mask material from the antioxidation film, it is possible to keep the separation region between devices within 1 μm, by employing the dry etching technique which is excellent industrially and favorable in uniformity.

(2) As a result, a semiconductor integrated circuit mounting high speed, low power consumption SOI structure devices at high density can be presented.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

FIG. 1 is a sectional view showing fabricating steps of a semiconductor device in a first embodiment of this invention.

Figure 1A:
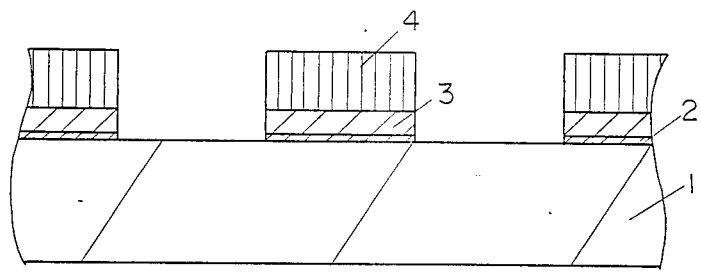
FIGS. 1A through 1H are sectional views showing a method of fabricating a semiconductor device in a first embodiment of this invention.

In the first place, as shown in FIG. 1A, on an n-type (100) silicon substrate 1, a silicon thermal oxidation film 2 with film thickness of 100 Å, a silicon nitride film 3 as an antioxidation film with film thickness of 2000 Å, and a silicon oxide film 4 with film thickness of 3000 Å as a dry etching resistant mask in two dry etching processes of anisotropic and isotropic processes are sequentially formed, and the portion other than the part to become a device region (separation region) is opened by strongly anisotropic reactive ion etching (R.I.E.) or the like.

Figure 1B:
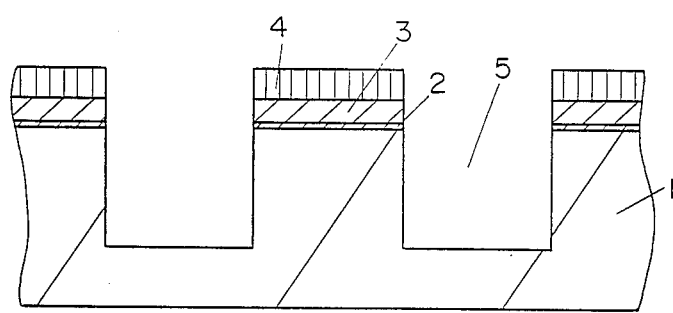

Next, as shown in FIG. 1B, the part to become a separation region is also etched by R.I.E. or other process, using the silicon oxide film 4 as the mask, and an opening 5 is formed. At this time, the film thickness of silicon oxide film 4 decreases, but there is left over a film thickness (over 1500 Å) usable later as etching mask of anisotropic etching of the thermal oxidation film and silicon nitride film and isotropic dry etching of the silicon substrate.

Figure 1C:
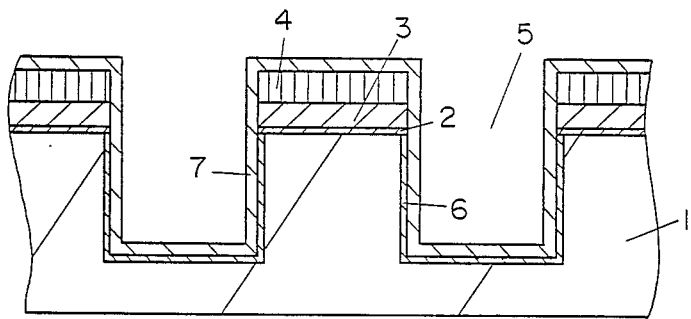

Then, as shown in FIG. 1C, thermal oxidation is effected using the silicon nitride film 3 as mask, and a silicon thermal oxidation film 6 with film thickness of 500 Å is formed, and then a silicon nitride film 7 with film thickness of 1000 Å is formed on the entire surface by reduced pressure CVD or other process. This reduced pressure CVD is employed, meanwhile, in order to deposit silicon nitride film 7 uniformly also on the side surface of the opening 5.

Figure 1D:
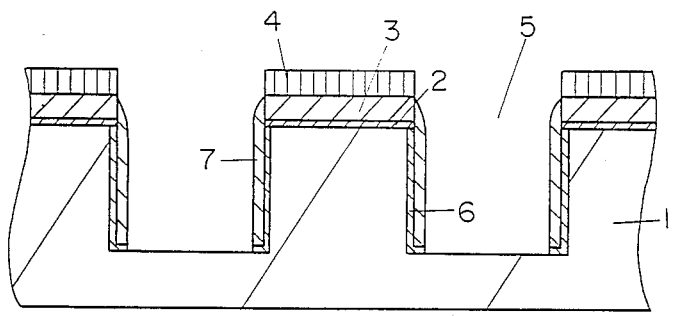
Figure 1E:
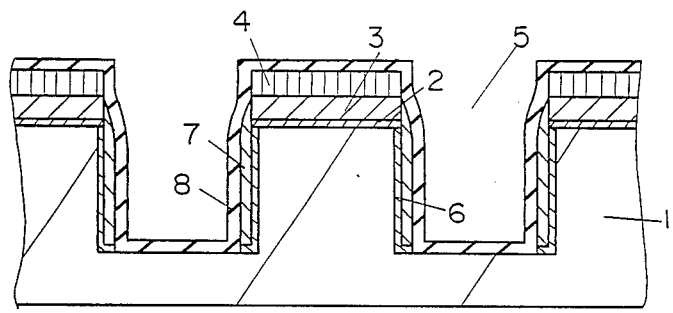
Figure 1F:
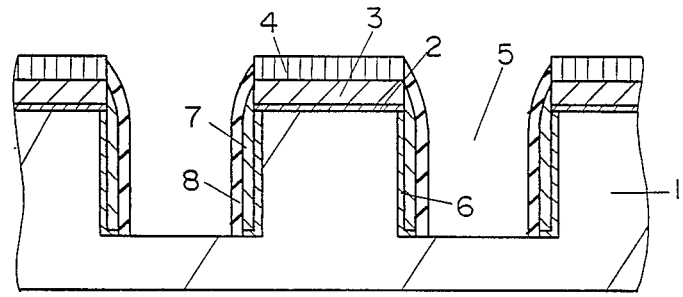
Figure 1G:
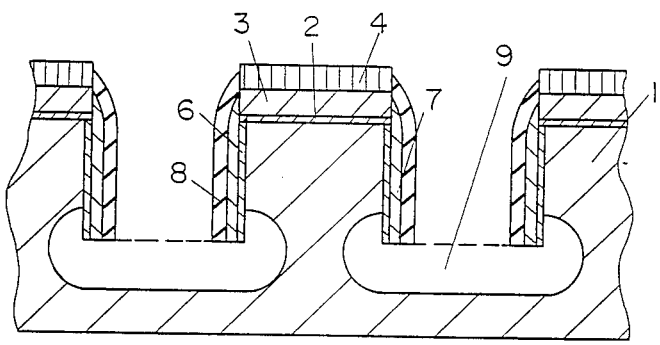

Afterwards, as shown in FIG. 1D, when a strongly anisotropic etching is effected by, for example, reactive ion etching, only the silicon thermal oxidation film and silicon nitride film 7 on the side wall of the opening 5 are left, and all other silicon oxide films and nitride films are removed. In this step, too, the film thickness of the silicon oxide film 4 decreases, but there is still a film thickness (over 500 Å) enough to be used later as etching mask in the isotropic dry etching process of the silicon substrate. Next, in order to leave the silicon oxide film as the masking material in the subsequent isotropic dry etching process, in a form being deposited on the silicon nitride film 7 on the side wall of the opening, a silicon oxide film 8 with film thickness of 1000 Å is formed on the entire surface by the same method, such as reduced pressure CVD, as in the previous step of silicon nitride film 7 (FIG. 1E), and the silicon oxide film 8 is removed, leaving only the side wall portion, by the reactive ion etching process (FIG. 1F). Consequently, using the silicon oxide films 4, 8 as masks, an opening 9 is formed by isotropic etching of the silicon substrate by microwave discharge using for example $CF_4$ nd $O_2$ gases (FIG. 1G). The etching method by using microwave discharge is very excellent in the selectivity of silicon substrate and silicon oxide film (Si/SiO2 selectivity ratio: 20 or more), compared with other dry etching methods, and therefore only a small film thickness is enough for the silicon oxide film 8 as the etching mask. Moreover, if the distance between silicon oxide films 8 on the adjacent device region sides is less than 0.2 $\mu$m, since isotropic etching progresses same as in other broad separation regions, the separation region width may be narrowed to under 1 $\mu$m, and the device can be formed at high density while maintaining the device shape of high uniformity. Or when employed the plasma etching or other method by using $SF_6$ gas, a certain effect will be obtained in the respect of enhancing the selectivity.

Figure 1H:
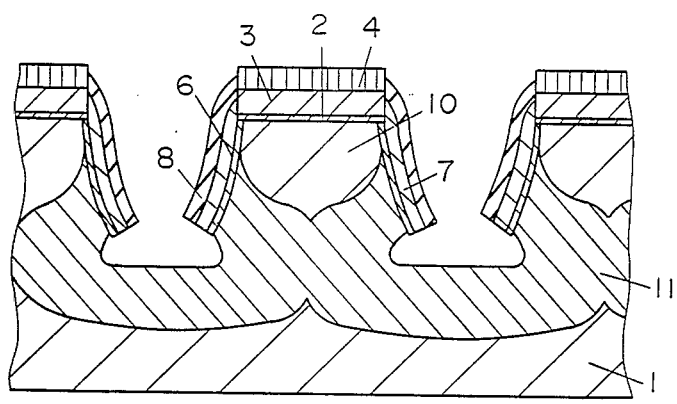

Later, as shown in FIG. 1H, when oxidation is effected at a pressure of about 7 atmospheric pressures by high pressure oxidation method, since the oxidized region is limited to the parts not covered with silicon nitride films 3, 7, a device region 10 composed of part of the silicon substrate 1 is isolated and insulated from the silicon substrate by the oxide film region 11 by optimizing the depth of opening, oxidation time, and device region width.

The subsequent steps are omitted. Finally, by the conventional method, a MOS device is formed by filling the separation region with silicon oxide film, polysilicon or the like.

Incidentally, when forming a MOS device in this device region 10, the thickness of the oxide film region 11 is a very influential factor for the threshold voltage of parasitic MOS of which gate in this oxide film region, or the parasitic capacity of the device region.

Figure 2:
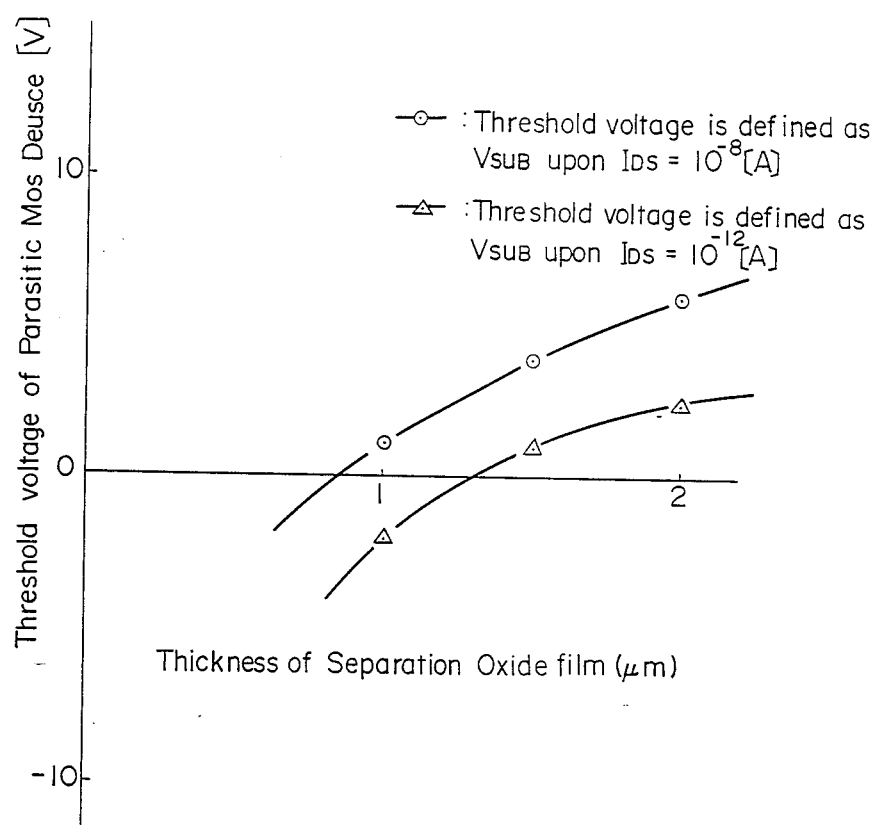
FIG. 2 is a graph illustrating the relationship between the thickness of separation oxidation film of this device and the threshold voltage of high speed MOS transistor.

FIG. 2 shows an example of dependency of parasitic MOS threshold voltage on the thickness of separation oxide film when forming a MOS device on the device region 10. In this case, it is known that, when the oxide film thickness is less than 1 $\mu$m, a leak current due to parasitic MOS flows.

Figure 3A:
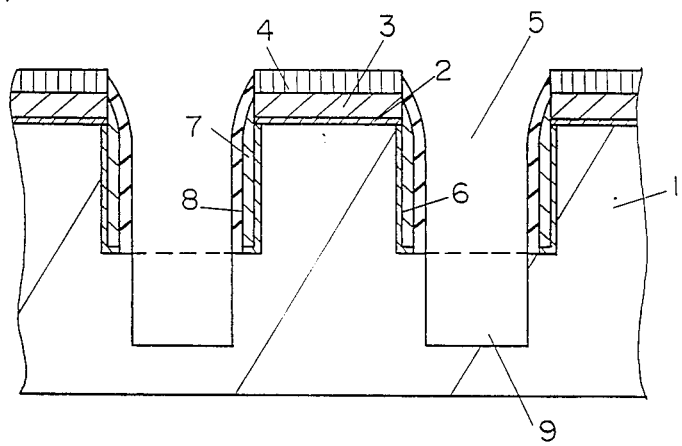
FIGS. 3A through 3C are sectional views showing a method of fabricating a semiconductor device in a second embodiment of this invention.
Figure 3B:
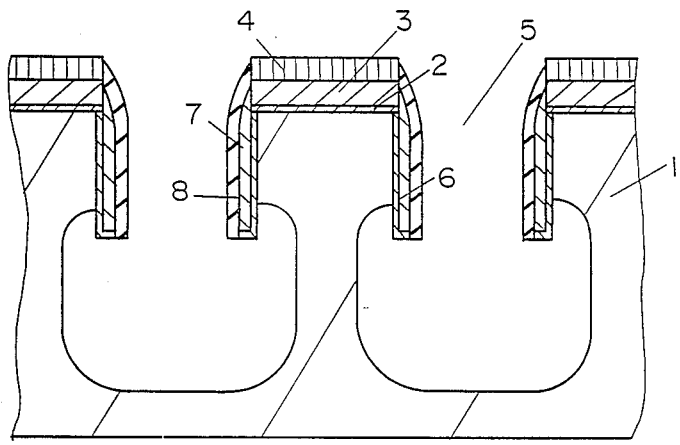
Figure 3C:
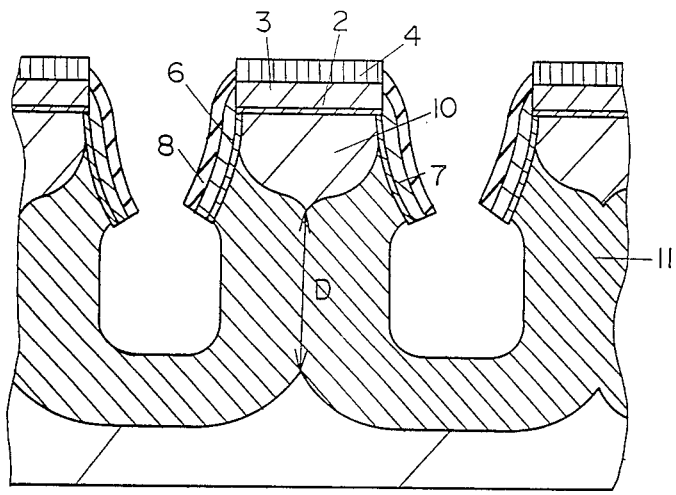

In the embodiment shown in FIG. 3, after the step of FIG. 1F, the silicon substrate is further subjected to anisotropic etching (FIG. 3A), and isotropic etching (FIG. 3B), then selective oxidation (FIG. 3C), and in this way the thickness of oxide film region is freely controlled. The opening 15 in FIG. 3A was formed due to anisotropic etching of the silicon substrate, and as clear from the comparison between FIG. 1H and FIG. 3C, the oxide film region is formed with a greater thickness for the portion of this anisotropic etching depth.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. A method of fabricating a semiconductor device comprising:
   a. a step of forming an opening in a semiconductor substrate using a first antietching film formed on said semiconductor substrate and a first antioxidation film as masks;
   b. a step of forming a second antioxidation film on a whole surface of said semiconductor substrate by a reduced pressure CVD method and anisotropically etching the the second antioxidation film to expose the first antietching film on a top surface and the semiconductor substrate at a bottom surface of the opening;
   c. a step of forming a second antietching film on a whole surface of the semiconductor substrate by a reduced pressure CVD method and anisotropically etching the second antietching film to expose the first antietching film on a top surface and the semiconductor substrate at a bottom surface of the opening, said second antietching film being left only on a sidewall of the opening and covering said second antioxidation film;
   d. a step of performing isotropic dry etching using said first and second antietching films as masks; and
   e. a step of performing a heat treatment in an oxidizing atmosphere using said first and second antioxidation films as masks.

2. The method of fabricating a semiconductor device according to claim 1, wherein step d. is performed by microwave discharge using $CF_4$, $O_2$ gas.

3. The method of fabricating a semiconductor device according to claim 1, wherein a silicon oxide film is used as the first and second antietching films.

4. The method of fabricating a semiconductor device according to claim 1, wherein a silicon nitride film is used as the first and second antioxidation films.

5. The method of fabricating a semiconductor device according to claim 1, wherein the semiconductor substrate is subjected to anisotropic etching at the bottom surface of the opening, using the first and second antietching films as masks, and then to isotropic etching.

6. A method of fabricating a semiconductor device comprising:

a. a step of forming an opening in a silicon substrate using a first silicon oxide film and a first silicon nitride film formed on said silicon substrate as masks;
b. a step of a forming a second silicon nitride film on a whole surface of said semiconductor substrate by a reduced pressure CVD method and anisotropically etching the second silicon nitride film to expose the first silicon oxide film on a top surface and the semiconductor substrate at a bottom surface of the opening;
c. a step of forming a second silicon oxide film by a reduced pressure CVD method and anisotropically etching the second silicon oxide film to expose the first silicon oxide film on a top surface and the semiconductor substrate at a bottom surface of the opening, said second silicon oxide film being left only on a sidewall of the opening and covering said second silicon nitride film;
d. a step of performing isotropic dry etch-using said first and second silicon oxide films as masks; and
e. a step of performing a heat treatment in an oxidizing atmosphere using said first and second silicon nitride films as masks.

* * * * *